United States Patent
Kong et al.

(10) Patent No.: US 9,508,755 B2
(45) Date of Patent: Nov. 29, 2016

(54) PIXEL UNIT AND METHOD OF FABRICATING THE SAME, ARRAY SUBSTRATE AND DISPLAY DEVICE

(71) Applicant: BOE TECHNOLOGY GROUP CO., LTD., Beijing (CN)

(72) Inventors: Xiangyong Kong, Beijing (CN); Dongfang Wang, Beijing (CN); Jun Cheng, Beijing (CN); Hongda Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 55 days.

(21) Appl. No.: 14/361,700

(22) PCT Filed: Nov. 28, 2013

(86) PCT No.: PCT/CN2013/088044
§ 371 (c)(1),
(2) Date: May 29, 2014

(87) PCT Pub. No.: WO2015/024318
PCT Pub. Date: Feb. 26, 2015

(65) Prior Publication Data
US 2015/0129881 A1 May 14, 2015

(30) Foreign Application Priority Data
Aug. 22, 2013 (CN) .......................... 2013 1 0370056

(51) Int. Cl.
*H01L 27/12* (2006.01)
*G02F 1/1362* (2006.01)

(52) U.S. Cl.
CPC ..... *H01L 27/1248* (2013.01); *G02F 1/136227* (2013.01); *H01L 27/1244* (2013.01); *H01L 27/1288* (2013.01)

(58) Field of Classification Search
None
See application file for complete search history.

(56) References Cited

U.S. PATENT DOCUMENTS 6,294,799 B1 * 9/2001 Yamazaki et al. .............. 257/72
2005/0007508 A1 1/2005 Saitou et al.
(Continued)

FOREIGN PATENT DOCUMENTS

CN 1717132 A 1/2006
CN 102893315 A 1/2013
(Continued)

OTHER PUBLICATIONS

First Office Action for corresponding Chinese Patent Application No. 201310370056.1, 18 pp. (including English translation), (May 26, 2015).
(Continued)

*Primary Examiner* — Daniel Luke
(74) *Attorney, Agent, or Firm* — Blakely, Sokoloff, Taylor & Zafman LLP

(57) ABSTRACT

The present invention provides a pixel unit including a thin film transistor and a pixel electrode, the thin film transistor includes a gate, a source and a drain, and the pixel electrode is electrically connected to the drain through a via hole. An upper end surface of the via hole is connected to the pixel electrode, and a lower end surface of the via hole is connected to the drain. The via hole is a step-shaped hole, and an area of the upper end surface of the via hole is larger than that of the lower end surface of the via hole. The present invention also provides a method of fabricating the pixel unit, an array substrate including the pixel unit, and a display device including the array substrate.

18 Claims, 4 Drawing Sheets

(56) References Cited

U.S. PATENT DOCUMENTS

| | | | |
|---|---|---|---|
| 2008/0135909 A1* | 6/2008 | Takeguchi et al. | 257/307 |
| 2010/0155733 A1* | 6/2010 | Moon et al. | 257/59 |
| 2011/0309397 A1* | 12/2011 | Cheng et al. | 257/98 |
| 2013/0043464 A1 | 2/2013 | Lu et al. | |
| 2015/0221680 A1* | 8/2015 | Nakata et al. | H01L 27/1244 |

FOREIGN PATENT DOCUMENTS

| | | |
|---|---|---|
| CN | 102969311 A | 3/2013 |
| CN | 103151305 A | 6/2013 |
| CN | 103199060 A | 7/2013 |
| CN | 103389605 A | 11/2013 |
| CN | 203502708 U | 3/2014 |
| JP | 11-126907 A | 5/1999 |
| JP | 2002-040411 A | 2/2002 |
| JP | 2006-215062 A | 8/2006 |
| JP | 2010-079152 A | 4/2010 |

OTHER PUBLICATIONS

PCT International Search Report for counterpart PCT Application No. PCT/CN2013/088044, 2 pp. (only English translation), (May 19, 2014).

PCT Written Opinion of the International Searching Authority for counterpart PCT Application No. PCT/CN2013/088044, 7 pp. (only English translation), (May 19, 2014).

\* cited by examiner

PIXEL UNIT AND METHOD OF FABRICATING THE SAME, ARRAY SUBSTRATE AND DISPLAY DEVICE

CROSS-REFERENCE TO RELATED APPLICATIONS

This patent application is a U.S. National Phase Application under 35 U.S.C. §371 of International Application No. PCT/CN2013/088044, filed Nov. 28, 2013, entitled PIXEL UNIT AND METHOD OF FABRICATING THE SAME, ARRAY SUBSTRATE AND DISPLAY DEVICE, which claims priority to Chinese Patent Application No. 201310370056.1, filed Aug. 22, 2013.

FIELD OF THE INVENTION

The present invention relates to the field of display technology, and more particularly, to a pixel unit, a method of fabricating the pixel unit, an array substrate including the pixel unit, and a display device including the array substrate.

BACKGROUND OF THE INVENTION

A display device (e.g., a liquid crystal panel) includes an array substrate, and generally, the array substrate includes a plurality of pixel units. FIG. 1 is a schematic diagram illustrating a structure of a pixel unit of a conventional array substrate. As shown in FIG. 1, the pixel unit of the array substrate includes at least a thin film transistor 100' and a pixel electrode 200, the thin film transistor 100' includes at least a source 110, a drain 120 and a gate 130, the pixel electrode 200 is electrically connected to the drain 120 of the thin film transistor 100' through a via hole 300'. In the array substrate, in order to reduce parasitic capacitance and improve flatness of an upper surface of the thin film transistor 100', an organic insulation layer 140 is generally provided above the source 110 and the drain 120 of the thin film transistor 100' as a planarization layer. The greater thickness of the organic insulation layer 140 is, the smaller the parasitic capacitance becomes. However, thickness increment of the organic insulation layer may cause increase in axial height of the via hole 300'. The greater the axial height of the via hole 300' is, the more likely the pixel electrode 200 fractures at a joint with the via hole 300'.

Consequently, how to avoid the fracture of the pixel electrode at the joint with the via hole while reducing the parasitic capacitance becomes the technical problem to be solved in the art.

SUMMARY OF THE INVENTION

An object of the present invention is to provide a pixel unit, a method of fabricating the pixel unit, an array substrate including the pixel unit, and a display device including the array substrate. In the pixel unit, the pixel electrode is not likely to fracture at the joint with the via hole.

To achieve the above object, according to one aspect of the present invention, there is provided a pixel unit including a thin film transistor and a pixel electrode, the thin film transistor includes a gate, a source and a drain, and the pixel electrode is electrically connected to the drain through a via hole. An upper end surface of the via hole is connected to the pixel electrode, and a lower end surface of the via hole is connected to the drain. The via hole is a step-shaped hole, and an area of the upper end surface of the via hole is larger than that of the lower end surface of the via hole.

The via hole may include a large via portion and a small via portion, one end surface of the large via portion is connected to the pixel electrode, one end surface of the small via portion is connected to the drain, and axial height of the large via portion is the same as that of the small via portion.

The thin film transistor may further include an organic insulation layer provided above the source and the drain of the thin film transistor, and the via hole penetrates the organic insulation layer.

The thin film transistor may further include an inorganic insulation layer provided between the organic insulation layer and the source and drain of the thin film transistor, and the via hole penetrates the inorganic insulation layer.

The via hole may include a large via portion and a small via portion, the large via portion and one part of the small via portion are provided in the organic insulation layer, and the other part of the small via portion is provided in the inorganic insulation layer.

The organic insulation layer may be made of a photosensitive resin, and an etching selectivity ratio between the inorganic insulation layer and the organic insulation layer may be no less than 10.

The inorganic insulation layer may be a single-layer structure made of any one of silicon oxide, silicon nitride, hafnium oxide and aluminum oxide, or the inorganic insulation layer may be a multi-layer structure made of any combination of silicon oxide, silicon nitride, hafnium oxide and aluminum oxide.

According to another aspect of the present invention, there is provided a method of fabricating a pixel unit, including steps of:

forming a thin film transistor;

forming a via hole that penetrates an upper surface of the thin film transistor to reach a drain of the thin film transistor, the via hole being a step-shaped hole, with area of an upper end surface of the via hole being larger than that of a lower end surface of the via hole; and forming a pixel electrode so that the pixel electrode is electrically connected to the drain through the via hole, the upper end surface of the via hole being connected to the pixel electrode and the lower end surface of the via hole being connected to the drain.

The step of forming the thin film transistor may include:

forming a source and a drain of the thin film transistor;

forming an inorganic insulation layer above the source and the drain; and forming an organic insulation layer on the inorganic insulation layer.

The via hole may include a large via portion and a small via portion, the organic insulation layer may be made of a photosensitive resin material, and an etching selectivity ratio between the inorganic insulation layer and the organic insulation layer may be no less than 10. When performing the step of forming the via hole, a first part corresponding to the small via portion of the thin film transistor may be fully exposed, and a second part of the thin film transistor may be half exposed, the second part surrounding the first part and being located at a part corresponding to the large via portion.

The organic insulation layer may be made of a photosensitive resin material, and an etching selectivity ratio between the inorganic insulation layer and the organic insulation layer may be no less than 10. The step of forming the via hole may include:

disposing a mask plate above the organic insulation layer and exposing the organic insulation layer, the mask plate including a non-transmissive region, a transmissive region and a semi-transmissive region, with the transmissive region corresponding to the small via portion and the semi-transmissive region corresponding to the large via portion; and developing the organic insulation layer and then etching the organic insulation layer after development and the inorganic insulation layer, so as to form the via hole penetrating the organic insulation layer and the inorganic insulation layer.

Alternatively, the via hole may include a large via portion and a small via portion, and the organic insulation layer may be made of a non-photosensitive resin material. When performing the step of forming the via hole, a first via penetrating the organic insulation layer and the inorganic insulation layer may be formed by a patterning process, area of a cross section of the first via may be the same as that of the small via portion, and after forming the first via, the large via portion may be formed by a patterning process.

In the step of forming the pixel electrode, the pixel electrode may be formed by an inkjet printing process.

The method may further include a step of:

performing an annealing process on the thin film transistor, with an annealing temperature in the range of 200° C. to 600° C. and an annealing holding time period in the range of 30 minutes to 3 hours.

According to yet another aspect of the present invention, there is provided an array substrate, including the pixel unit according to the embodiments of the present invention described above.

According to still another aspect of the present invention, there is provided a display device, including the array substrate according to the embodiments of the present invention described above.

In the array substrate according to the embodiments of the present invention, since the via hole is a step-shaped hole, and the upper end surface of the via hole having the larger cross sectional area is connected to the pixel electrode, a good contact may be formed between the pixel electrode and the upper end surface of the via hole, thereby preventing the pixel electrode from fracturing at the joint with the via hole. The pixel unit according to the embodiments of the present invention has relatively small parasitic capacitance, and further the pixel electrode of the array substrate is not likely to fracture.

BRIEF DESCRIPTION OF THE DRAWINGS

The drawings which constitute a part of the description are used for providing further understanding of the present invention and for explaining the present invention together with following embodiments, but not for limiting the present invention. In the drawings.

DETAILED DESCRIPTION

Hereinafter, the embodiments of the present invention will be described in detail with reference to the accompanying drawings. It should be understood that the embodiments described herein are only the exemplary embodiments employed for illustrating and explaining the principle of the present invention, but the present invention is not limited thereto.

It is noted that the spatial terms "upper", "above", "lower" and "below" in the embodiments of the present invention refer to the directions of "upper", "above", "lower" and "below" shown in FIG. 2.

Figure 1:
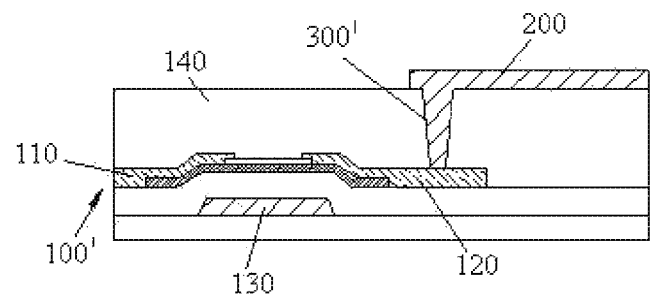
FIG. 1 is a schematic diagram illustrating a structure of a pixel unit of an array substrate in the prior art.
Figure 2:
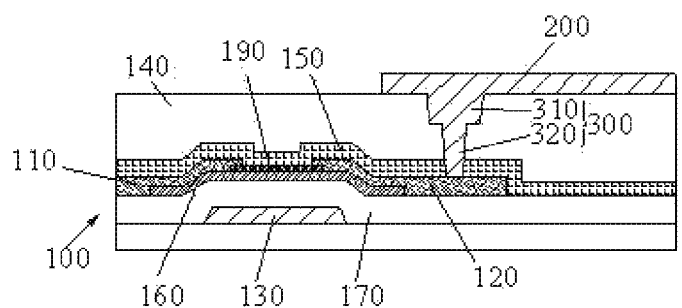
FIG. 2 is a schematic diagram illustrating a structure of a pixel unit according to an embodiment of the present invention.

As shown in FIG. 2, according to one aspect of the present invention, there is provided a pixel unit including a thin film transistor 100 and a pixel electrode 200. The thin film transistor 100 includes a gate 130, a source 110 and a drain 120, the pixel electrode 200 is electrically connected to the drain 120 through a via hole 300, the upper end surface of the via hole 300 is connected to the pixel electrode 200, and the lower end surface of the via hole 300 is connected to the drain 120 of the thin film transistor 100. The via hole 300 is a step-shaped hole, and the area of the upper end surface of the via hole 300 is larger than that of the lower end surface of the via hole 300.

In order to reduce the parasitic capacitance, an organic insulation layer 140 with relatively large thickness is generally provided above the source 110 and the drain 120 of the thin film transistor 100. The via hole 300 penetrates the organic insulation layer 140 to reach the drain 120. The via hole 300 is provided as a step-shaped hole, and the upper end surface of the via hole 300 having larger cross sectional area is connected to the pixel electrode 200.

In the embodiment of the present invention, since the via hole 300 is the step-shaped hole, a good contact may be formed between the pixel electrode 200 and the upper end surface of the via hole 300, thereby preventing the pixel electrode 200 from fracturing at the joint with the via hole 300.

When the thickness of the organic insulation layer 140 is relatively large, the via hole 300 according to the embodiments of the present invention can not only ensure the electrical connection between the pixel electrode 200 and the drain 120 of the thin film transistor 100, but also improve strength of joint between the pixel electrode 200 and the via hole 300. Accordingly, the array substrate according to the embodiments of the present invention has relatively small parasitic capacitance, and further the pixel electrode 200 of the array substrate is not likely to fracture at the joint with the via hole 300.

Figure 3:
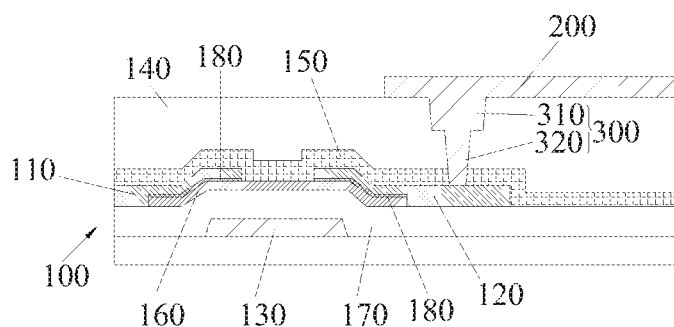
FIG. 3 is a schematic diagram illustrating a structure of a pixel unit according to an embodiment of the present invention.

Referring to FIG. 3, the thin film transistor 100 may further include a gate 130, an active layer 160, a gate insulation layer 170 and an ohmic contact layer 180.

The thin film transistor may have a top gate type structure (i.e., the gate 130 is disposed above the active layer 160), or may have a bottom gate type structure (i.e., the gate 130 is disposed below the active layer 160). FIG. 2 illustrates the thin film transistor having the bottom gate type structure.

The source 110 and the drain 120 may be made of any one or any combination of Mo, MoNb, Al, AlNd, Ti and Cu. The source 110 or the drain 120 may be formed as a single-layer metal structure; alternatively, the source 110 or the drain 120 may be formed as a multi-layer metal structure. For example, Mo, Al or alloy containing Mo and Al may be used to form the single-layer or the multi-layer metal structure of the source 110 or the drain 120.

In the embodiments of the present invention, the gate 130 may be made of one or more of Mo, MoNb, Al, AlNd, Ti and Cu. The gate 130 may have a single-layer structure made of one of the above materials, or may have a stacked structure made of more than one of the above materials. For example, the gate 130 may be the stacked structure of Mo and Al. Generally, the gate 130 may have thickness in the range of 100 nm to 500 nm.

In the embodiments of the present invention, the gate insulation layer 170 may be made of one or more of silicon oxide ($SiO_x$), silicon nitride ($SiN_x$), hafnium oxide ($HfO_x$), silicon oxynitride (SiON), aluminum oxide ($AlO_x$) and the like, or may have the stacked structure made of more than one of the above materials. For example, the gate insulation layer 170 may be the stacked structure of $SiN_x/SiO_x$, or may be the stacked structure of $SiN_x/SiON/SiO_x$. Generally, the gate insulation layer 170 may have thickness in the range of 300 nm to 600 nm. The gate insulation layer 170 may be formed by PECVD (plasma enhanced chemical vapor deposition).

In the embodiments of the present invention, the active layer 160 may be formed by PECVD, with thickness in the range of 30 nm to 200 nm.

The ohmic contact layer 180 is directly connected to the active layer 160 to form the ohmic contact. The ohmic contact layer 180 may be formed by doping the active layer 160 with phosphorus, aluminum, etc. Generally, thickness of the ohmic contact layer 180 is controlled to be in the range of 30 nm to 100 nm.

In the embodiments of the present invention, there is no specific limit to the position and the structure of the ohmic contact layer 180, as long as the ohmic contact layer 180 directly contacts the active layer 160. For example, as shown in FIG. 3, the ohmic contact layer 180 may be disposed on the upper surface of the active layer 160 at both sides, and the source 110 and the drain 120 cover the ohmic contact layer 180 disposed on the surface of the active layer 160 at both sides, respectively.

In some embodiments of the present invention, as shown in FIG. 2, an etch stop layer 190 may be disposed on the upper surface of the active layer 160, and may be disposed between the source 110 and the drain 120.

In the embodiments of the present invention, there is no specific limit to the shape of the cross section of the via hole 300, that is, the shape of the cross section of the via hole 300 may be a circle, an ellipse or a square.

As shown in FIG. 2 and FIG. 3, the via hole 300 includes the large via portion 310 and the small via portion 320. To prevent the via hole 300 from fracturing at the step between the large via portion 310 and the small via portion 320, for example, the axial height of the large via portion 310 may be the same as that of the small via portion 320.

In order to prevent moisture absorbed by the active layer 140 from gathering at the source 110 and the drain 120 of the thin film transistor 100, for example, the thin film transistor 100 may further include an inorganic insulation layer 150. The inorganic insulation layer 150 is disposed above the source 110 and the drain 120 of the thin film transistor 100, and the organic insulation layer 140 is disposed above the inorganic insulation layer 150, that is, the inorganic insulation layer 150 is disposed between the organic insulation layer 140 and the source 110 and the drain 120 of the thin film transistor 100. In this case, the via hole 300 penetrates the inorganic insulation layer 150 and the organic insulation layer 140. Specifically, the large via portion 310 and one part of the small via portion 320 are provided in the organic insulation layer 140, and the other part of the small via portion 320 is provided in the inorganic insulation layer 150.

In the embodiments of the present invention, there is no specific limit to the material of the inorganic insulation layer 150. For example, the inorganic insulation layer 150 may be a single-layer structure made of any one of silicon oxide ($SiO_x$), silicon nitride ($SiN_x$), hafnium oxide ($HfO_x$) and aluminum oxide ($AlO_x$). Alternatively, the inorganic insulation layer 150 may be a multi-layer structure made of any combination of the above materials. For example, the inorganic insulation layer 150 may have thickness in the range of 300 nm to 600 nm.

In the embodiments of the present invention, there is no specific limit to the material of the organic insulation layer 140, as long as the organic insulation layer 140 separates the source and the drain of the thin film transistor 100 from the pixel electrode 200.

In the embodiments of the present invention, the organic insulation layer 140 may be made of resin material. The resin material may be photosensitive resin material, or may be non-photosensitive resin material.

As an embodiment of the present invention, in the case that the inorganic layer 150 is not provided, when the organic insulation layer 140 may be made of the non-photosensitive resin material, a first layer of photoresist may be applied on the organic insulation layer 140 before forming the via hole 300, then the first layer of photoresist is exposed and developed, and the organic insulation layer 140 is etched to form the large via portion 310 in the organic insulation layer 140; and then, a second layer of photoresist is applied, the second layer of photoresist is exposed and developed, and etching is performed to form the small via portion 320.

As another embodiment of the present invention, in the case that the inorganic insulation layer 150 is provided, the organic insulation layer 140 may be made of the photosensitive resin material, and an etching selectivity ratio between the inorganic insulation layer 150 and the organic insulation layer 140 may be set to be no less than 10. That is, an etching rate of the organic insulation layer 140 is smaller than that of the inorganic insulation layer 150 when etching is performed using the same etchant. The characteristics of the organic insulation layer 140 made of the photosensitive resin material is the same as that of photoresist, and the organic insulation layer 140 may be used as an etch stop layer for the inorganic insulation layer 150 when fabricating the pixel unit, thereby reducing a patterning process. Hereinafter, how to utilize the organic insulation layer 140 as the etch stop layer for the inorganic insulation layer 150 will be described.

According to another aspect of the present invention, as shown in FIG. 4 and FIGS. 5a through 5i, there is provided a method of fabricating a pixel unit, the method includes steps of:

Step 10: forming a thin film transistor 100 (FIGS. 5a through 5g);

Step 20: forming a via hole 300 (FIG. 5h), the via hole 300 penetrates an upper surface of the thin film transistor 100 to reach a drain 120 of the thin film transistor 100, the via hole 300 is a step-shaped hole, and area of an upper end surface of the via hole 300 is larger than that of a lower end surface of the via hole 300; and Step 30: forming a pixel electrode 200 (FIG. 5i), so that the pixel electrode 200 is electrically connected to the drain 120 of the thin film transistor 100 through the via hole 300, the upper end surface of the via hole 300 is connected to the pixel electrode 200, and the lower end surface of the via hole 300 is connected to the drain 120 of the thin film transistor 100.

Figure 5A:
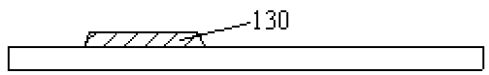
FIGS. 5a through 5i are schematic diagrams illustrating the method of fabricating the pixel unit according to an embodiment of the present invention.
Figure 5B:
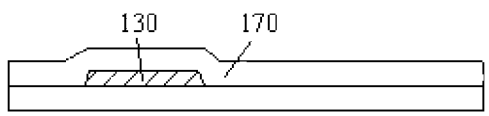
Figure 5C:
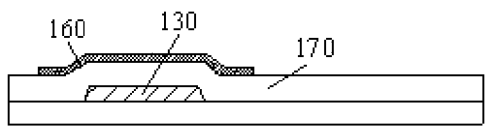
Figure 5D:
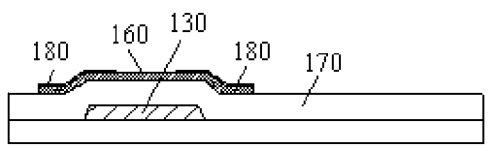
Figure 5E:
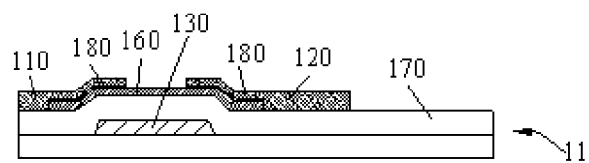
Figure 5F:
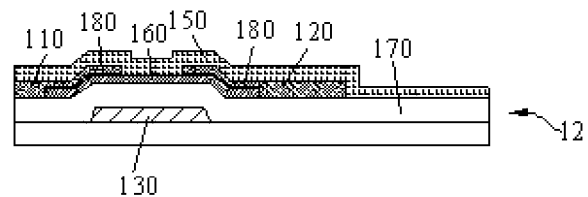
Figure 5G:
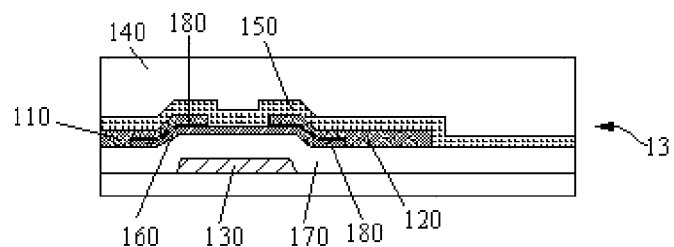
Figure 5H:
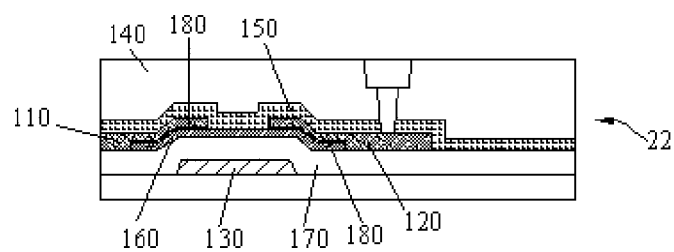

The Step 10 of forming the thin film transistor 100 may include:

Step 11: forming a source 110 and the drain 120 of the thin film transistor 100 (FIG. 5e);

Step 12: forming an inorganic insulation layer 150 on the source 110 and the drain 120 (FIG. 5f);

Step 13: forming an organic insulation layer 140 on the inorganic insulation layer 150 (FIG. 5g).

As described above, the inorganic insulation layer 150 may be a single-layer structure made of any one of silicon oxide ($SiO_x$), silicon nitride ($SiN_x$), hafnium oxide ($HfO_x$) and aluminum oxide ($AlO_x$). Alternatively, the inorganic insulation layer 150 may be a multi-layer structure made of any combination of the above materials. The inorganic insulation layer 150 may be formed by PECVD.

As described above, the organic insulation layer 140 is formed to reduce the parasitic capacitance, and the inorganic insulation layer 150 is formed to prevent the moisture absorbed by the organic insulation layer 150 from gathering at the source 110 and the drain 120 of the thin film transistor 100. The organic insulation layer 140 may be formed by PECVD.

The person skilled in the art will appreciate that, before the Step 11, the Step 10 of forming the thin film transistor 100 may further include steps of: providing a substrate; forming a gate 130 on the substrate (FIG. 5a); forming a gate insulation layer 170 on the substrate on which the gate 130 is formed (FIG. 5b); forming an active layer 160 on the gate insulation layer 170 (FIG. 5c); and forming an ohmic contact layer 180 on the active layer 160 (FIG. 5d).

Figure 5I:
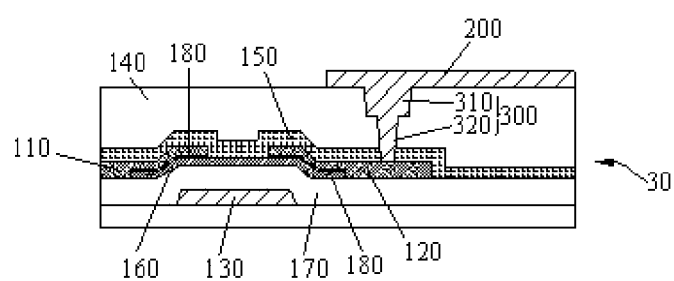

As shown in FIG. 5i, the via hole 300 includes a large via portion 310 and a small via portion 320. For example, axial height of the large via portion 310 is the same as that of the small via portion 320, thereby preventing the via hole 300 from fracturing at the step where the large via portion 310 is connected to the small via portion 320.

In the embodiments of the present invention, the via hole 300 may be formed in various ways, for example, when the organic insulation layer 140 is made of non-photosensitive resin material, a first via penetrating the organic insulation layer 140 and the inorganic insulation layer 150 may be formed by a patterning process, with area of cross section of the first via being the same as that of the small via portion 320. After forming the first via, the large via portion 310 may be formed by a patterning process. The via hole 300 including the large via portion 310 and the small via portion 320 may be formed by two patterning processes.

Alternatively, the via hole 300 including the large via portion 310 and the small via portion 320 may be formed by a single patterning process. The organic insulation layer 140 may be made of photosensitive resin material, and an etching selectivity ratio between the inorganic insulation layer 150 and the organic insulation layer 140 may be set to be not smaller than 10. When performing the Step 20, a first part of the thin film transistor corresponding to the small via portion 320 may be fully exposed, and a second part of the thin film transistor that surrounds the first part and is located to correspond to the large via portion 310 may be half exposed. That is, projection of the half exposure region of the thin film transistor on a plane is annular.

Hereinafter, how to form the via hole 300 including the large via portion 310 and the small via portion 320 will be described in detail.

The via hole 300 may be formed by utilizing the organic insulation layer 140 as the etch stop layer for the inorganic insulation layer 150. That is, the Step 20 of forming the via hole 300 may include Step 21 and Step 22.

Step 21: disposing a mask plate above the organic insulation layer 140 and exposing the organic insulation layer 140, the mask plate including a non-transmissive region, a transmissive region and a semi-transmissive region, with the transmissive region corresponding to the small via portion 320 and the semi-transmissive region corresponding to the large via portion 310.

Specifically, the transmissive region extends through the thickness direction of the mask plate, and thickness of the semi-transmissive region is smaller than that of the transmissive region.

Step 22: developing the organic insulation layer 140 and then etching the organic insulation layer after development and the inorganic insulation layer 150, so as to form the via hole 300 penetrating the organic insulation layer 140 and the inorganic insulation layer 150.

Specifically, since the organic insulation layer 140 is made of the photosensitive resin material, the part of the organic insulation layer 140 corresponding to the large via portion 310 may be denatured, and the part of the organic insulation layer 140 corresponding to the small via portion 320 may be developed. The denatured part of the organic insulation layer 140 may be etched away by the etchant, that is, the part of the organic insulation layer 140 corresponding to the large via portion 310 may be etched away, thereby forming the large via portion 310. Meanwhile, the part of the inorganic insulation layer 150 corresponding to the small via portion 320 may directly contact the etchant, and may be etched away by the etchant, thereby finally forming the small via portion 320.

It should be appreciated that, the transmissive region corresponding to the small via portion 320 described herein refers to that the position of the transmissive region corresponds to that of the small via portion 320, and that the area of the cross section of the transmissive region corresponds to that of the small via portion 320. Similarly, the semi-transmissive region corresponding to the large via portion 310 refers to that the position of the semi-transmissive region corresponds to that of the large via portion 310, and that the area of the cross section of the semi-transmissive region corresponds to that of the large via portion 310.

As described above, the via hole 300 is provided as the step-shaped hole, which can prevent the pixel electrode 200 from fracturing at the joint with the via hole 300.

Further, the organic insulation layer 140 may be made of the photosensitive resin material, which can reduce the number of the used the mask plates and simplify the fabricating method.

The person skilled in the art should appreciate that, the term "corresponding" used herein may refer to exactly the same or scale up or down.

After forming the via hole 300, the pixel electrode layer may be formed on the organic insulation layer 140 by a deposition process, and the pixel electrode 200 may be formed by a patterning process.

To simplify the fabricating process, the pixel electrode 200 may be formed by an inkjet printing process in the Step 30.

In the embodiments of the present invention, the pixel electrode 200 may be formed by the use of material of ITO (indium tin oxide).

To reduce the resistance of the pixel electrode 200, for example, the method according to the embodiments of the present invention may further include a Step 40 of performing an annealing process on the thin film transistor, with an annealing temperature in the range of 200° C. to 600° C. and an annealing holding time period in the range of 30 minutes to 3 hours.

Performing an annealing process on the array substrate described herein refers to that the annealing process is mainly performed on the pixel electrode 200. Performing an annealing process on the pixel electrode 200 may allow texture of the pixel electrode 200 to be recrystallized and may facilitate the grain refinement of the pixel electrode 200, thereby reducing the resistance of the pixel electrode 200.

Figure 4:
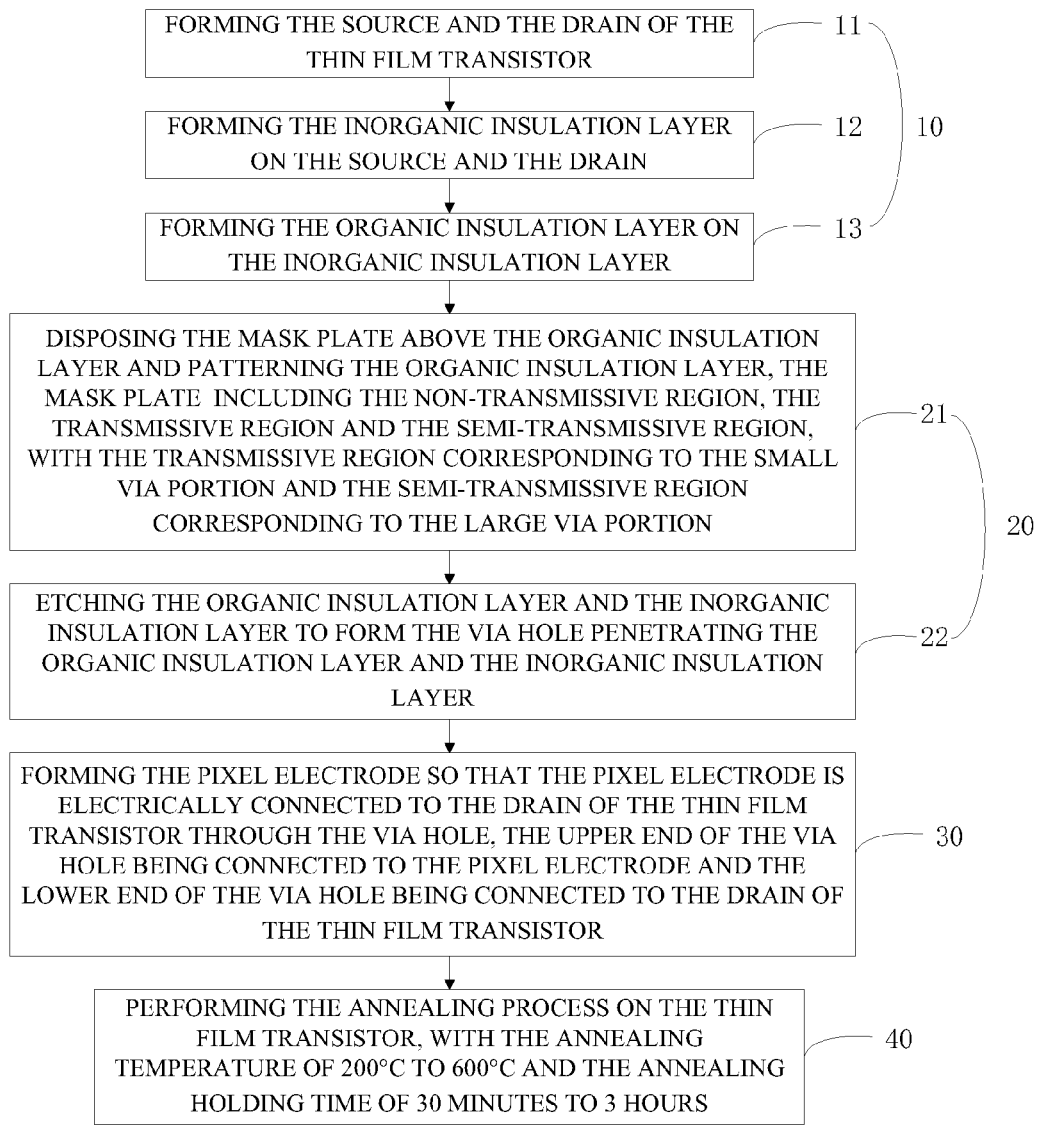
FIG. 4 is a flow chart of a method of fabricating the pixel unit according to an embodiment of the present invention.

It should be appreciated that, the downward arrows in FIG. 4 and the order of "a" to "i" in FIGS. 5a through 5i represent the order that the steps in the fabricating method according to the embodiments of the present invention are performed.

According to yet another aspect of the present invention, there is provided an array substrate including at least one pixel unit according to the embodiments of the present invention described above. For example, each pixel unit in the array substrate is the pixel unit according to the above embodiment of the present invention.

According to still another aspect of the present invention, there is provided a display device including the array substrate according to the above embodiment of the present invention. In the array substrate, the via hole 300 connecting the pixel electrode 200 to the drain 120 of the thin film transistor is the step-shaped hole, which not only allows the organic insulation layer to have larger thickness, but also prevents the pixel electrode 200 from fracturing at the joint with the via hole 300.

The display device according to the embodiments of the present invention may further include a color filter substrate disposed with respect to the array substrate.

It should be appreciated that the above embodiments are only the exemplary embodiments employed for illustrating the principle of the present invention, but the present invention is not limited thereto. It will be apparent to those skilled in the art that modifications and variations can be made without departing from the spirit and scope of the present invention, and these modifications and variations are also considered to fall within the scope of protection of the present invention.

What is claimed is:

1. A pixel unit, including a thin film transistor and a pixel electrode, the thin film transistor including a gate, a source and a drain, the pixel electrode being electrically connected to the drain through a via hole, wherein a via-hole electrode is provided to fill the via hole, an upper end surface of the via-hole electrode is connected to a lower surface of the pixel electrode, and a lower end surface of the via-hole electrode is connected to the drain, the via hole is a step-shaped hole, and an area of the upper end surface of the via-hole electrode is larger than that of the lower end surface of the via-hole electrode, the via hole includes a large via portion and a small via portion, the via-hole electrode includes a large electrode portion corresponding to the large via portion and a small electrode portion corresponding to the small via portion, and one end surface of the large electrode portion is connected to the pixel electrode, one end surface of the small electrode portion is connected to the drain, and a height of the large electrode portion along a vertical direction is the same as that of the small electrode portion.

2. The pixel unit according to claim 1, wherein the thin film transistor further includes an organic insulation layer provided above the source and the drain of the thin film transistor, and the via hole penetrates the organic insulation layer.

3. The pixel unit according to claim 2, wherein the thin film transistor further includes an inorganic insulation layer provided between the organic insulation layer and the source and drain of the thin film transistor, and the via hole penetrates the inorganic insulation layer.

4. The pixel unit according to claim 3, wherein the large electrode portion and one part of the small electrode portion are provided in the organic insulation layer, and the other part of the small electrode portion is provided in the inorganic insulation layer.

5. The pixel unit according to claim 3, wherein the organic insulation layer is made of a photosensitive resin, and an etching selectivity ratio between the inorganic insulation layer and the organic insulation layer is no less than 10.

6. The pixel unit according to claim 5, wherein the inorganic insulation layer is a single-layer structure made of any one of silicon oxide, silicon nitride, hafnium oxide and aluminum oxide, or the inorganic insulation layer is a multi-layer structure made of any combination of silicon oxide, silicon nitride, hafnium oxide and aluminum oxide.

7. A method of fabricating a pixel unit, comprising:

forming a thin film transistor;

forming a via hole that penetrates an upper surface of the thin film transistor to reach a drain of the thin film transistor, the via hole being a step-shaped hole, an area of an upper end surface of the via hole being larger than that of a lower end surface of the via hole; and forming a via-hole electrode that fills the via hole and forming a pixel electrode so that the pixel electrode is electrically connected to the drain through the via hole, wherein an area of an upper end surface of the via-hole electrode is larger than that of a lower end surface of the via-hole electrode, the upper end surface of the via-hole electrode is connected to a lower surface of the pixel electrode and the lower end surface of the via-hole electrode is connected to the drain, the via hole includes a large via portion and a small via portion, the via-hole electrode includes a large electrode portion corresponding to the large via portion and a small electrode portion corresponding to the small via portion, and one end surface of the large electrode portion is connected to the pixel electrode, one end surface of the small electrode portion is connected to the drain, and a height of the large electrode portion along a vertical direction is the same as that of the small electrode portion.

8. The method according to claim 7, wherein forming the thin film transistor comprises:

forming a source and a drain of the thin film transistor;

forming an inorganic insulation layer above the source and the drain; and forming an organic insulation layer on the inorganic insulation layer.

9. The method according to claim 8, wherein the organic insulation layer is made of a photosensitive resin material, and an etching selectivity ratio between the inorganic insulation layer and the organic insulation layer is no less than 10; and when forming the via hole, a first part corresponding to the small via portion of the thin film transistor is fully exposed, and a second part of the thin film transistor is half exposed, the second part surrounding the first part and being located at a part corresponding to the large via portion.

10. The method according to claim 9, wherein
forming the via hole comprises:
disposing a mask plate above the organic insulation layer and exposing the organic insulation layer, the mask plate including a non-transmissive region, a transmissive region and a semi-transmissive region, with the transmissive region corresponding to the small via portion and the semi-transmissive region corresponding to the large via portion; and
developing the organic insulation layer, and then etching the organic insulation layer subjected to development and etching the inorganic insulation layer, so as to form the via hole penetrating the organic insulation layer and the inorganic insulation layer.

11. The method according to claim 8, wherein
the organic insulation layer is made of a non-photosensitive resin material; and
when forming the via hole, a first via penetrating the organic insulation layer and the inorganic insulation layer is formed by a patterning process, area of a cross section of the first via being the same as that of the small via portion, and after forming the first via, the large via portion is formed by a patterning process.

12. The method according to claim 7, wherein
the pixel electrode is formed by an inkjet printing process.

13. The method according to claim 12, further comprising:
performing an annealing process on the thin film transistor, with an annealing temperature in the range of 200° C. to 600° C. and an annealing holding time period in the range of 30 minutes to 3 hours.

14. An array substrate, including a pixel unit comprising a thin film transistor and a pixel electrode, the thin film transistor including a gate, a source and a drain, the pixel electrode being electrically connected to the drain through a via hole, wherein
a via-hole electrode is provided to fill the via hole, an upper end surface of the via-hole electrode is connected to a lower surface of the pixel electrode, and a lower end surface of the via-hole electrode is connected to the drain,
the via hole is a step-shaped hole, and an area of the upper end surface of the via-hole electrode is larger than that of the lower end surface of the via-hole electrode,
the via hole includes a large via portion and a small via portion, the via-hole electrode includes a large electrode portion corresponding to the large via portion and a small electrode portion corresponding to the small via portion, and
one end surface of the large electrode portion is connected to the pixel electrode, one end surface of the small electrode portion is connected to the drain, and a height of the large electrode portion along a vertical direction is the same as that of the small electrode portion.

15. The array substrate according to claim 14, wherein
the thin film transistor further includes an organic insulation layer provided above the source and the drain of the thin film transistor, and the via hole penetrates the organic insulation layer.

16. The array substrate according to claim 15, wherein
the thin film transistor further includes an inorganic insulation layer provided between the organic insulation layer and the source and drain of the thin film transistor, and the via hole penetrates the inorganic insulation layer.

17. The array substrate according to claim 16, wherein
the large electrode portion and one part of the small electrode portion are provided in the organic insulation layer, and the other part of the small electrode portion is provided in the inorganic insulation layer.

18. The array substrate according to claim 16, wherein
the organic insulation layer is made of a photosensitive resin, and an etching selectivity ratio between the inorganic insulation layer and the organic insulation layer is no less than 10.

* * * * *